（12) United States Patent
Mei et al.

(10) Patent No.: US 8,969,733 B1
(45) Date of Patent: Mar. 3, 2015

(54) HIGH POWER RF CIRCUIT

(71) Applicant: Anaren, Inc., East Syracuse, NY (US)

(72) Inventors: Chong Mei, Jamesville, NY (US);
Michael J. Len, Skaneateles, NY (US);
Hans P. Ostergaard, East Syracuse, NY (US)

(73) Assignee: Anaren, Inc., East Syracuse, NY (US)

( * ) Notice: Subject to any disclaimer, the term of this patent is extended or adjusted under 35 U.S.C. 154(b) by 0 days.

(21) Appl. No.: 14/041,155

(22) Filed: Sep. 30, 2013

(51) Int. Cl.
*H05K 1/00* (2006.01)
*H05K 1/02* (2006.01)
*H01P 3/06* (2006.01)
*H01L 23/12* (2006.01)

(52) U.S. Cl.
CPC ........................................ *H05K 1/02* (2013.01)
USPC ........... 174/258; 174/252; 361/746; 333/244; 257/700

(58) Field of Classification Search
USPC .................. 333/115, 116, 185, 204, 244, 246; 257/700, 702, 706, 723, 724, 728; 174/252, 255–257; 361/735, 739, 746
See application file for complete search history.

(56) References Cited

U.S. PATENT DOCUMENTS

| | | | |
|---|---|---|---|
| 3,581,243 A * | 5/1971 | Alford | 333/116 |
| 4,646,038 A | 2/1987 | Wanat | |
| 4,821,007 A * | 4/1989 | Fields et al. | 333/238 |
| 5,032,803 A | 7/1991 | Koch | |
| 5,369,379 A | 11/1994 | Fujiki | |
| 5,446,314 A | 8/1995 | Melnick et al. | |
| 5,499,005 A * | 3/1996 | Gu et al. | 333/246 |
| 5,557,245 A * | 9/1996 | Taketa et al. | 333/116 |
| 5,717,249 A | 2/1998 | Yoshikawa et al. | |
| 5,742,210 A * | 4/1998 | Chaturvedi et al. | 333/116 |
| 5,841,328 A * | 11/1998 | Hayashi | 333/116 |
| 5,952,970 A * | 9/1999 | Kawahata | 343/700 MS |
| 6,033,787 A | 3/2000 | Nagase et al. | |
| 6,705,393 B1 | 3/2004 | Hsu | |
| 6,756,860 B2 * | 6/2004 | Shin | 333/116 |
| 6,758,264 B2 | 7/2004 | Azuma | |
| 6,815,810 B2 | 11/2004 | Takehara et al. | |
| 6,822,532 B2 * | 11/2004 | Kane et al. | 333/116 |
| 6,900,708 B2 * | 5/2005 | White et al. | 333/185 |
| 6,956,449 B2 * | 10/2005 | Snyder et al. | 333/116 |
| 7,128,979 B2 | 10/2006 | Nagase et al. | |
| 7,321,098 B2 | 1/2008 | Sarma et al. | |
| 7,728,694 B2 | 6/2010 | Jensen et al. | |
| 8,044,749 B1 * | 10/2011 | Witas et al. | 333/116 |
| 8,164,177 B2 | 4/2012 | Matz et al. | |

OTHER PUBLICATIONS

Ding Shilhu, Yao Xi, Lu Xudong and Yang Yong, Multilayer Microwave Resonators With Bi-Based Dielectric Ceramics, Ceramics International 30, 2004, pp. 1191-1193.

* cited by examiner

*Primary Examiner* — Hoa C Nguyen
(74) *Attorney, Agent, or Firm* — Daniel P. Malley; Bond Schoeneck & King, PLLC

(57) ABSTRACT

The present invention is directed to an RF device that includes a ceramic layer characterized by a ceramic layer dielectric constant and includes an RF circuit arrangement having a predetermined geometry and predetermined electrical characteristics. The ceramic layer dissipates thermal energy generated by the RF circuit via substantially the entire ceramic surface area. A first dielectric layer comprises a thermoplastic material and has a predetermined first thickness and a first dielectric constant. The predetermined electrical characteristics of the RF circuit arrangement are a function of the ceramic layer dielectric constant. A relative softness of the thermoplastic material is a function of the RF device operating temperature.

42 Claims, 13 Drawing Sheets

TYPICAL LTCC OT HTCC CONDUCTOR CROSS SECTIONAL SHAPE

TYPICAL CONDUCTOR CROSS SECTIONAL SHAPE

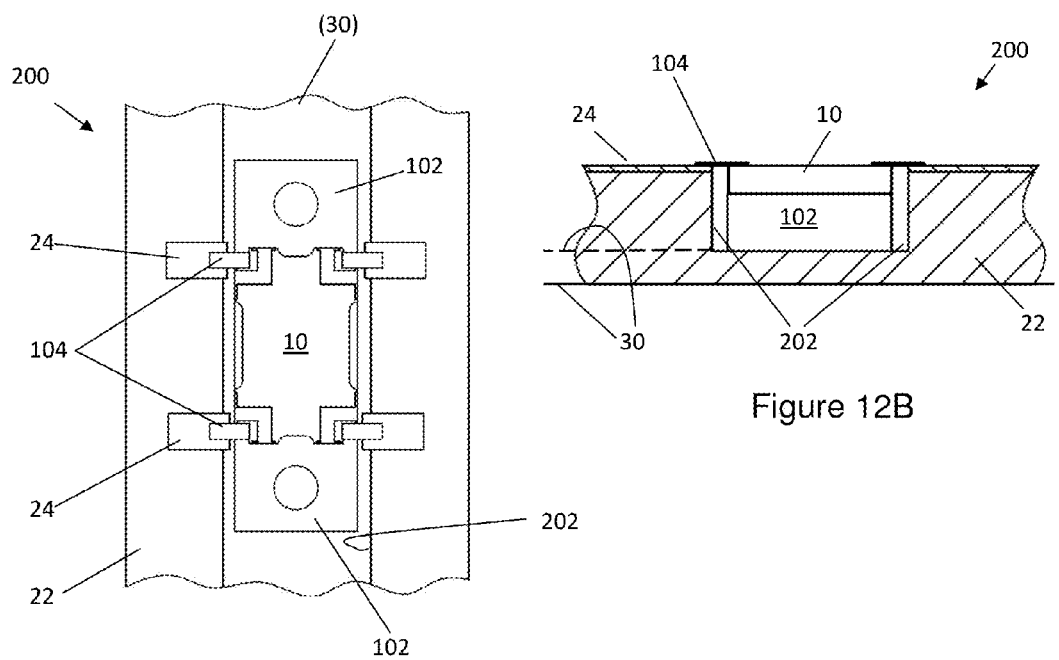
Figure 12A
Figure 12B
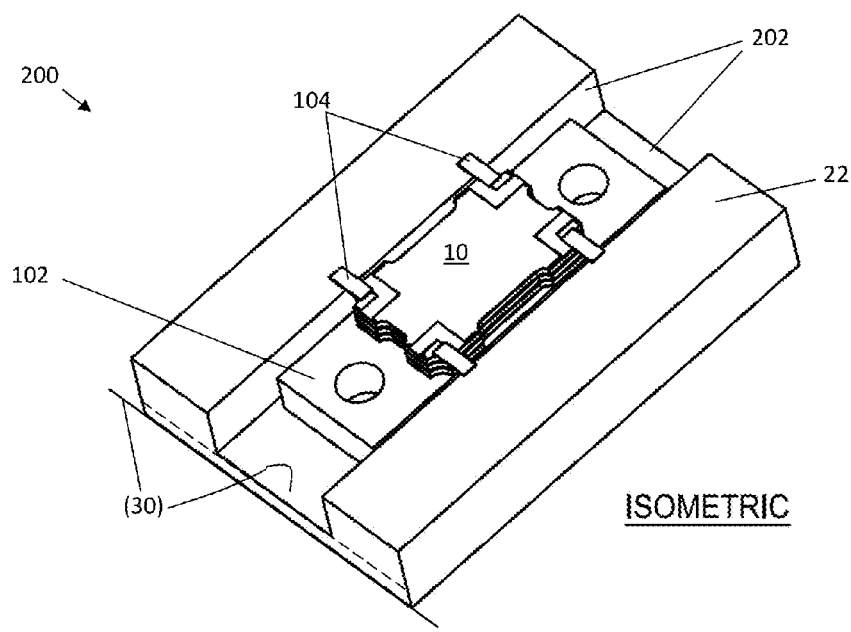
Figure 12C

HIGH POWER RF CIRCUIT

BACKGROUND OF THE INVENTION

1. Field of the Invention

The present invention relates generally to RF devices, and particularly to relatively high power RF devices with improved thermal characteristics.

2. Technical Background

Nowadays, the primary use of some mobile phones (e.g., smartphones) is data communications rather than voice communications. More and more of the public is using their mobile telephones for Internet access, social media access and for downloading videos and pictures from both of these sources. Thus, the demand for mobile data services is growing at an exponential rate. This necessarily means that the bandwidth provided by the telecommunications infrastructure (as well as the mobile telephone handset itself) must continue to grow if it is to keep pace with the demand. In order to accomplish this, new mobile telephone handsets and new base station equipment must be configured to operate over multiple frequency bands and communications systems (e.g., Wi-Fi, 3G, 4G, Bluetooth, etc.). Stated differently, new mobile telephones and base stations must provide more functionality in the same (or less) space. Because radio frequency (RF) devices such as power amplifiers, couplers, baluns, etc., are integral parts of every wireless device or system, they must also do more in a smaller footprint. Accordingly, size reduction, improved heat dissipation, power handling, and cost reduction are important considerations for today's RF component designs.

Referring to FIG. 1, a sectional view of a conventional softboard RF device 1 is shown. The RF device 1 includes three softboard layers (1, 2, and 3) that are laminated together to form an integrated device. Before lamination is performed, conductive traces 4 are disposed on the middle softboard layer 2 by way of conventional photolithographic methods. One of the advantages of using all-softboard related devices relates to their excellent RF performance. One reason for this is that softboard devices use photolithographic processes for circuit trace fabrication; photolithography produces excellent conductive traces (i.e., high purity copper traces that have an excellent shape) that exhibit low conductor resistivity (e.g., Cu—1.7 µΩ-cm; Ag—1.55 µΩ-cm; and Au—2.2 µΩ-cm). Moreover, softboard devices are easily configured to match the coefficient of thermal expansion (CTE) of the SMT carrier printed circuit board (PCB). As a result, the reliability of softboard devices is typically excellent. Finally, softboard devices are amenable to being manufactured in large batches, which typically results in lower costs.

On the other hand, the maximum power handling abilities of softboard based RF circuits is relatively low because they are characterized by relatively poor thermal resistance and Maximum Operating Temperature (MOT). Power Handing is a function of thermal conductivity, electrical performance, circuit geometry, and part size. MOT is a function of material properties. Typical FR4 has a MOT of 130° C. Teflon based PCB materials have a MOT up to 280° C. Polyamides have a MOT>200° C. Copper has an MOT of 130° C. in air. The material with the lowest MOT sets the limit for the entire system. Standard softboard dielectrics have a relatively low thermal conductivity of about 0.25 W/mK up to 1 W/mK, with doped softboard dielectrics reaching up to about 3 W/mK.

Referring to the heat distribution pattern 5 shown in FIG. 1, the amount of heat that is laterally conducted by softboard type devices is rather limited. Those skilled in the art assume that the thermal energy generated by all-softboard devices dissipates at about a 45° angle through the softboard dielectric materials. Thus, the thermal distribution pattern 5 is limited to a small region on each major surface of the device 1. Accordingly, one drawback to this approach is that the thermal energy is dissipated over a rather small surface area, and as a result, the thermal energy builds up over time and becomes problematic. In other words, the power handling of the device is limited by its heat dissipation capabilities. All-softboard devices typically exhibit a low maximum continuous operating temperature (e.g., about 120° C. to 200° C. typical). The glass transition temperature (Tg) is also relatively low (e.g., 75° C. to 150° C. being typical values for standard PCB materials).

Referring to FIG. 2, a top view of the conventional softboard RF device depicted in FIG. 1 is shown. This view represents a typical configuration that provides three edge vias 6 on each side thereof, with one edge via 6 disposed on each end. Using the dimensions in the illustration, and assuming 1 mil thick copper, the surface area provided by each via is about 0.05 mm$^2$. The combined area (for three vias) is about 0.149 mm$^2$. Even if one were able to direct the thermal energy to the edge of the device, there is only a small surface area available for heat dissipation.

Instead of using softboard dielectric layers, some manufacturers produce RF circuits (e.g., couplers) using low temperature co-fired ceramic (LTCC) or (high temperature co-fired ceramic) HTCC ceramic technology. Some of the advantages of ceramic devices include: high thermal conductivity (30 W/m° C. to 170 W/m° C. typical); low thickness variations (when lapped +/−0.0005 in typical); high maximum continuous operating temperatures (500° C. to 2000° C. typical); and a high glass transition temperature (Tg). On the other hand, the maximum power handling of ceramic RF devices is limited by solder joint failure (Reflow or cracked solder joint) at the device-to-carrier PCB interface (solder joint reflow often leads to a failed solder joint). For the solder reflow failure mode, the all-ceramic RF device can become so hot that the solder reflows and the device separates from the carrier PCB. Stated differently, the high thermal conductivity of conventional ceramic devices can lead to device failure if the power level is not limited. The cracked solder joint failure mode is typically due to the CTE mismatch between the all-ceramic RF device and the softboard carrier PCB (Ceramic exhibits a CTE of about 5 ppm/T typical whereas the carrier PCB exhibits a CTE of about 15 to 25 ppm/° C. typical in x/y axis).

In addition, all-ceramic RF devices have a relatively low RF performance (vis à vis softboard devices) due to the conductor material and conductor shape tolerance. Thus, RF circuits based on either all-softboard or all-ceramic constructions have inherent features which limit their maximum high power rating and reliability. Moreover, when an RF device is used in a surface mount technology (SMT) assembly, the device is mounted on a carrier PCB and the thermal path is further degraded by the carrier PCB.

Referring to FIG. 3, a cross-sectional view of a conventional LTCC or HTCC (all-ceramic) device 1 is shown. The ceramic device 1 includes three ceramic layers (2, 3 and 4) with traces 5 formed on the center ceramic layer 3. In this view, the cross-sectional shape of the conductor 5 is of interest. A conventional all-ceramic RF device 1 typically employs a process whereby the circuit traces are screen printed. As a result, the conductive traces 5 exhibit high resistivity due to porosity and impurities. The high resistivity of the conductors 5 is due to their being made from an Ag or a W (5.7 microohm-cm) paste. Moreover, the cross-sectional shape is not conducive to high RF performance. Accordingly, the performance of these RF devices is poor relative to softboard devices. Finally, the size of the footprint of a panel of ceramic devices (before singulation) is relatively small (e.g., about 4"×4" to 6"×6") as compared to softboard panels (which may be 12"×18" to 18"×24" before singulation).

Referring to FIGS. 4A and 4B, cross-sectional views of conventional surface mount technology (SMT) power amplifiers 1000 are shown. Often, conventional power amplifiers are fabricated using SMT plastic over-molded transistors because these components offer the lowest cost option to the manufacturer. As shown in FIG. 4A, a transistor die 1002 is soldered or epoxied (20) to a copper slug 1008 for heat dissipation purposes. The RF input contact pad 1012 and the RF output contact 1014 are connected to PCBs 1010 by leads 1006. The PCBs or ceramic boards 1010 are connected to the transistor 1002 via leads 1004. The entire device 1000 is covered by a plastic over-mold 1100. The copper slug 1008 is then mounted on a carrier PCB 22 (not shown) so that the maximum operating temperature of the die 1002 and the plastic over-mold 1100 is not exceeded. FIG. 4B is another conventional power amplifier 1000 example, and includes flip chip amplifier 1002 mounted on PCB (or ceramic board) 1010. The pads or solder balls of the flip chip 1002 are connected to corresponding pads of the PCB 1010 by solder connections 1016. The PCB (or ceramic board) 1010 is mounted on copper slug 1008 which functions as a heat sink. This arrangement includes leads 1004 which are used to connect the board 1010 to the I/O pads 1012, 1014.

FIG. 5 is a plan view of a circuit configuration 1200 that includes the conventional power amplifier 1000 depicted in FIG. 4. Note that the transistors (1002) have an input and output impedance that is significantly lower than the 50 Ohm system impedance, and therefore, a matching network is needed. As a result, the conventional SMT plastic over-molded transistor 1000 shown in FIG. 5 requires both an input matching network 1014 and an output matching network 1016. As a result, the device configuration 1200 occupies too much PCB "real estate."

What is needed, therefore, is an improved RF device that solves the coefficient of thermal expansion (CTE) mismatches and RF performance issues related to ceramic based circuits, while simultaneously solving the heat dissipation issues related to softboard based circuits. An RF device is needed that efficiently distributes heat laterally throughout substantially the entire center substrate layer for improved thermal performance. An RF device is needed that has a PCB interface layer that is substantially matched to the CTE of the carrier PCB (i.e., has a relatively low Modulus of Elasticity) to prevent solder joint failure. Finally, an RF device is needed that has all of the above stated improvements in a small compact package that occupies a relatively small footprint on the carrier PCB.

SUMMARY OF THE INVENTION

The present invention addresses the needs described above by providing an improved RF device that solves the coefficient of thermal expansion (CTE) mismatches and RF performance issues related to ceramic based circuits, while simultaneously solving the heat dissipation issues related to softboard based circuits. The present invention efficiently distributes heat laterally through substantially the entire center substrate layer for improved thermal performance. The present invention has a PCB interface layer that is substantially matched to the CTE of the carrier PCB (i.e., has a relatively low Modulus of Elasticity) to prevent solder joint failure. The present invention is a small compact package that occupies a relatively small footprint on the carrier PCB. The present invention can be implemented in a standard SMT package or as a flanged device which can be directly attached to a Heat Sink.

One aspect of the present invention is directed to an RF device for use in an RF circuit assembly, the RF device being configured to be coupled to an RF circuit assembly interface having an interface modulus of elasticity. The device includes a ceramic layer having a ceramic surface area having a first ceramic major surface and a second ceramic major surface. The ceramic layer is characterized by a ceramic layer dielectric constant, a ceramic layer thickness, and a ceramic modulus of elasticity. The ceramic layer also includes an RF circuit arrangement having a predetermined geometry and predetermined electrical characteristics. The ceramic layer is configured to dissipate thermal energy generated by the RF circuit via substantially the entire ceramic surface area. A first dielectric layer includes a first outer major surface configured to be coupled to the RF circuit assembly interface and a first inner major surface coupled to the second ceramic major surface. The first dielectric layer has a predetermined first thickness, a first dielectric constant and a predetermined first modulus of elasticity. The predetermined electrical characteristics of the RF circuit arrangement are a function of the ceramic layer dielectric constant, the ceramic layer thickness, the first dielectric constant, the predetermined first thickness and the predetermined geometry. The predetermined first modulus of elasticity is substantially lower than the interface modulus of elasticity and the ceramic modulus of elasticity such that the first dielectric layer substantially conforms to the ceramic layer and the RF circuit assembly interface when an RF device operating temperature cycles between a maximum and minimum value.

In another aspect, the RF circuit arrangement is formed on the ceramic layer by a photolithographic process.

In another aspect, the RF circuit arrangement is selected from a group of RF circuit arrangements that include a stripline RF circuit, a microstrip RF circuit, a hybrid coupler, a power amplifier, an impedance transformer, a balun or an RF cross-over device.

Another aspect of the present invention is directed to an RF device for use in an RF circuit assembly, the RF device being configured to be coupled to an RF circuit assembly interface having an interface modulus of elasticity. The device includes a first dielectric layer having a first outer major surface and a first inner major surface. The first dielectric layer also has a predetermined first thickness and a first dielectric constant. A ceramic layer includes a ceramic surface area having a first ceramic major surface coupled to the first inner major surface and a second ceramic major surface. The ceramic layer is characterized by a ceramic layer dielectric constant and a ceramic modulus of elasticity. The ceramic layer also includes an RF circuit arrangement having a predetermined geometry and predetermined electrical characteristics. The ceramic layer is configured to dissipate thermal energy generated by the RF circuit via substantially the entire ceramic surface area. A second dielectric layer includes a second outer major surface configured to be coupled to the RF circuit assembly interface and a second inner major surface coupled to the second ceramic major surface. The second dielectric layer has a predetermined second thickness, a second dielectric constant and a predetermined second modulus of elasticity. The predetermined electrical characteristics of the RF circuit arrangement are a function of the ceramic layer dielectric constant, the predetermined geometry, the first thickness, the second thickness, the first dielectric constant and the second dielectric constant. The predetermined first modulus of elasticity is substantially lower than the interface modulus of elasticity and the ceramic modulus of elasticity such that the second dielectric layer substantially conforms to the ceramic layer and the RF circuit assembly interface when an RF device operating temperature cycles between a maximum and minimum value.

In another aspect, a first conductive ground plane layer is coupled to the first outer major surface, and a second conductive ground plane is coupled to the second outer major surface.

In another aspect, the RF circuit arrangement is selected from a group of RF circuit arrangements that include a stripline RF circuit, a microstrip RF circuit, a hybrid coupler, a power amplifier, an impedance transformer, a balun or an RF cross-over device.

In another aspect, the ceramic layer is further comprised of a first ceramic layer characterized by a first ceramic layer dielectric constant and a first ceramic modulus of elasticity. The first ceramic layer also includes a first RF circuit arrangement having a first predetermined geometry and first predetermined electrical characteristics. At least one second ceramic layer is characterized by at least one second ceramic layer dielectric constant and a at least one second ceramic modulus of elasticity, the at least one second ceramic layer also including at least one second RF circuit arrangement having at least one second predetermined geometry and at least one second predetermined electrical characteristics.

In another aspect, the first RF circuit arrangement and the at least one second RF circuit arrangement are configured to form a balun or an impedance transformer or a vertical interdigital coupler.

In another aspect, the first RF circuit arrangement and the at least one second RF circuit arrangement are configured to form three or more broadside coupled transmission lines.

In another aspect, the device further includes: a third dielectric layer including a third outer major surface coupled to the first inner major surface and a third inner major surface, the third dielectric layer having a predetermined third thickness and a third dielectric constant; a fourth dielectric layer including a fourth outer major surface coupled to the third major inner surface and a fourth inner major surface, the fourth dielectric layer having a predetermined fourth thickness and a fourth dielectric constant; and a fifth dielectric layer including a fifth outer major surface coupled to the fourth inner surface and a fifth inner major surface coupled to the ceramic layer, the fifth dielectric layer having a predetermined fifth thickness and a fifth dielectric constant.

In another aspect, the device further includes a ground plane layer disposed between the third outer major surface and the first outer major surface.

In another aspect, the fourth dielectric layer is a second ceramic layer characterized by a second ceramic layer dielectric constant, the second ceramic layer also including a second RF circuit arrangement having a second predetermined geometry and second predetermined electrical characteristics, the second ceramic layer being configured to dissipate thermal energy generated by the second RF circuit arrangement via substantially the entire ceramic surface area.

In another aspect, the third dielectric layer, the fourth dielectric layer, and the fifth dielectric layer are ceramic layers.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention and together with the description serve to explain the principles and operation of the invention.

BRIEF DESCRIPTION OF THE DRAWINGS

FIG. 12A-12C include a plan view, a side view and an isometric view of the RF device depicted in FIGS. 11A-11C and disposed in a PCB cavity;

DETAILED DESCRIPTION

Figure 1:
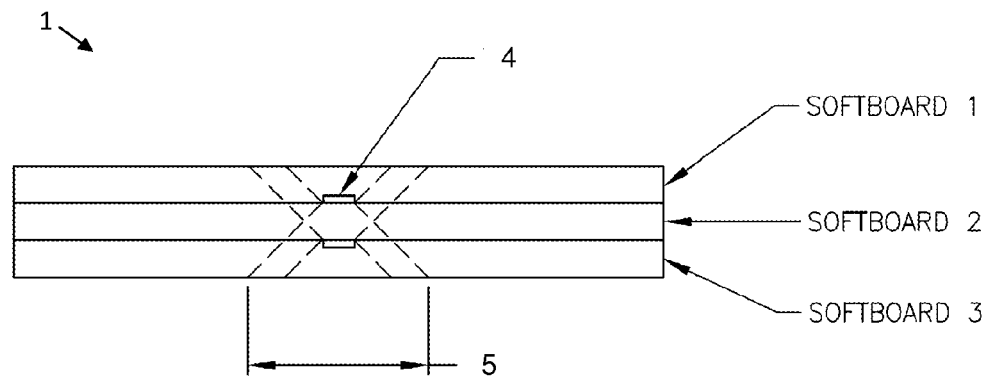
FIG. 1 is a sectional view of a conventional softboard layered RF device.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the RF device of the present invention is shown in FIG. 6, and is designated generally throughout by reference numeral 10.

Figure 6:
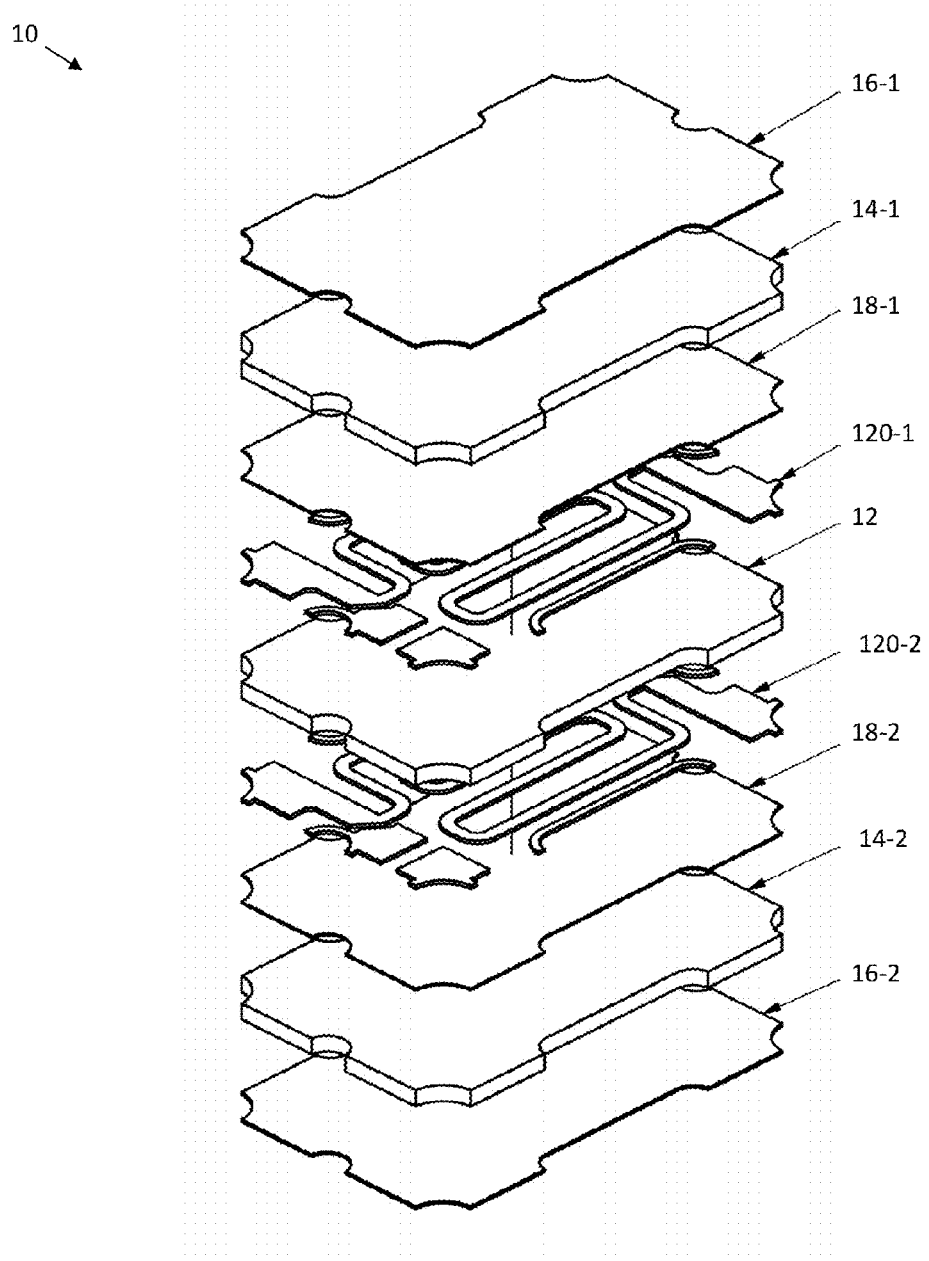
FIG. 6 is an exploded view of an RF device in accordance with an embodiment of the present invention.

As embodied herein and depicted in FIG. 6, an exploded view of an RF device 10 in accordance with one embodiment of the present invention is disclosed. The RF device 10 includes a center ceramic layer 12 that includes circuit traces 120-1 formed on one major surface thereof and circuit traces 120-2 formed on an opposing major surface of the center ceramic layer 12. A softboard layer 14-1 is disposed over the major surface of ceramic layer 12 that includes the circuit trace 120-1 and a second softboard layer 12-2 is disposed on the opposite side of the ceramic layer 12 that includes the circuit trace 120-2 formed thereon. Optional bonding layers 18-1 and 18-2 may be disposed between softboard layer 14-1 and ceramic layer 12, and softboard layer 14-2 and ceramic layer 12, respectively. Conductive ground planes 16-1 and 16-2 are disposed over the outer major surfaces of softboard 14-1 and softboard 14-2, respectively. Once these layers are assembled, they are bonded together or laminated to form device 10.

In one embodiment, the ceramic layer 12 is pre-fired before the various layers (12-18) are laminated because it is relatively easy to punch via holes into soft green ceramic material rather than drilling holes into hardened fired ceramic afterward. After the ceramic is fired, it is typically lapped as a standard operation. (In certain cases, e.g., when the ceramic is relatively thick, this step is not performed). The lapping operation provides a ceramic layer that is characterized by substantially flat top and bottom surfaces such that the thickness variation is very small. Typical thickness tolerances for a lapped ceramic are about +/−0.0005 in; this value is independent of the nominal thickness. (Typical softboard materials have a thickness tolerance of +/−10% with a minimum thickness tolerance of +/−0.0005 in). Both of these parameters are important when it comes to obtaining the best RF performance. In addition, an optional plasma treatment of the ceramic layers may be performed to increase adhesion during the metallization step.

Those skilled in the art will appreciate that drilling holes in a fired ceramic by a laser, or via mechanical means, is a slow process. By punching any required through features in the ceramic while in the green state, the manufacturing time is greatly reduced. As a result of this process, a larger quantity of ground vias or slots can be easily formed in the green state to reduce the thermal resistance and increase RF performance (by having better grounding). Moreover, because the added vias are formed in the green state, the manufacturing time and cost are not dramatically increased.

In accordance with an exemplary embodiment of the present invention, the ceramic is metalized by bonding or cladding metal foil (Cu, Ag, and Au) onto the fired ceramic. This process results in a substantially smooth metal surface and substantially improves RF performance. Note that the standard industry practice for metalizing fired ceramic typically employs sputter techniques, or "plated up" metallization, on ceramic. Both of these conventional techniques result in a relatively rough surface which degrades the RF performance of the device. If the RF performance of the device does not need to be optimized, the sputter and plate up technique may be employed. After the ceramic layer is metalized, the circuit traces are imaged onto the metal layer by photolithographic techniques. The traces are revealed by etching the conductive foil 120 disposed on the ceramic layer 12. By employing photolithographic techniques, the conductive circuit traces (120-1, 120-2) have sharp (i.e., relatively square) edges that provide excellent RF performance. If the traces are comprised of silver (Ag) instead of copper (Cu), they can operate at higher temperatures before the traces oxidize.

The outer layers of softboard must also be foil bonded to provide the ground planes (16-1, 16-2). The foil bond process may be accomplished using any suitable means in accordance with the end application such as a direct bond (green high thermal conductivity (HTC) laminate), direct bond with skive layer of PTFE on HTC, or with laminate (e.g., FEP/PFA). After the outer layer is disposed on the softboard, the outer layer may be etched to expose vias or other through holes.

Subsequently, the softboard outer dielectric layers (14-1, 14-2) are bonded to the ceramic center layer 12 and holes/slots may be laser drilled through HTC. The vias or through-holes also must be plated with a conductive material. Finally, the various devices on a manufactured panel are singulated to provide a number of the individual RF devices 10.

The softboard outer dielectric layers 14-1 and 14-2 may be implemented using any suitable material that has a low Modulus of Elasticity (e.g., non-glass reinforced PTFE). This family of materials has excellent RF performance, high Maximum Continuous Operating Temperature, and can be directly bonded to the ceramic without additional adhesive materials. The lower softboard layer 14-2 that interfaces with the customer's (i.e., the carrier) printed circuit board is particularly important, however, and must have a modulus of elasticity that is lower than the interface material 20 (See, e.g., FIG. 8). The interface material 20 may be implemented by solder, epoxy or by some other suitable material. Those skilled in the art will appreciate that solder has a modulus of about $5\times10^6$ psi and suitable epoxies may have similar values. The modulus of PTFE, a Teflon material, is $3\times10^5$ psi. Thus, the modulus of elasticity of the lower softboard layer 14-2 in this example is roughly 10 times softer than the interface material 20. Those skilled in the art will appreciate that as the operating temperature of the device increases, the ceramic layer 12 and the interface layer 20 will expand at different rates because they have different CTEs. Ordinarily, the heating and cooling cycles mechanically stress the device, but in the present invention, softboard layer 14-2 is configured to conform to both the upper (Ceramic) and lower (interface) layers because it is softer than both of these layers. The ability of layer 14-2 to conform to the layers disposed on either side of it thus prevents mechanical failure due to fatigue from thermal cycling.

In general, ceramic materials have a CTE of about 5 ppm/deg C (i.e., in all three dimensions) and a very high Modulus of elasticity (in other words, ceramic layers are very stiff and rigid after firing). In contrast, softboard dielectric materials have CTEs that range from about 15 to 30 ppm/degC in the x and y axes, depending on their construction. Moreover, there are a wide range of materials to choose from (e.g., epoxy, polyimide, PTFE, glass reinforced materials, non-glass reinforced materials, etc.) that have a wide range of values (for the modulus of elasticity). Accordingly, since the softboard materials have a higher CTE and a lower modulus of elasticity, they will tend to conform to the materials they are bonded to (on both sides) as the temperatures increase and decrease during thermal cycling. The lower layer 14-2 typically functions as the carrier PCB interface during an SMT operation.

Accordingly, the lower layer 14-2 may be comprised of a thermoplastic material (i.e., a thermo-softening plastic), which is a material that becomes pliable or moldable above a specific temperature, and returns to a solid state upon cooling. Thus, the thermoplastic materials (Teflon, PTFE, etc.) that are used to implement layer 14-2 are configured to withstand the temperature cycling associated with RF device operation. As those skilled in the art will appreciate, the above described "thermal reversibility" of thermoplastic materials differs from thermosetting polymers or resins because thermoset materials form irreversible chemical bonds when cured (heated). Stated differently, most thermosetting materials are not suitable for layer 14-2 because they typically do not melt and do not reform upon cooling, but rather, break down and fail. Many epoxy materials are thermosetting materials, and thus, would not be suitable for the lower layer 14-2. Having said that, there are a few epoxy materials that have a very low modulus and, thus, would be suitable for layer 14-2 because they are still soft enough to deform and conform to adjacent layers after setting occurs.

As shown in FIG. 6, the dielectric layers (14-1, 14-2) are optionally bonded to the ceramic center layer 12 with an adhesive (18-1, 18-2) that also has a low modulus of elasticity. Non-limiting examples of such adhesives include thermoplastics (e.g., PFA & FEP) or other "prepregs" used for flex-circuits. As described herein, both the upper and lower dielectric layers 14-1, 14-2 are typically comprised of softboard materials. However, in certain high power applications the upper layer 14-1 may be replaced with a ceramic material.

The RF Circuit of the present invention is fabricated from a combination of ceramic and softboard dielectric materials using photolithographic etch processes. As a result, the present invention has achieved advantageous results that are rather unexpected. For example, the ceramic layer provides high thermal conductivity in the center of the device such that heat is dissipated over the entire surface area of the device, including the device edges. This substantially uniform heat dissipation feature allows the device to be operated at higher power levels. On the other hand, the use of outer softboard layers yields a device that exhibits excellent RF performance. The RF performance is further enhanced by the low thickness variation of the center ceramic layer (see above). The RF performance is further optimized by the low conductor resistivity obtained using the above-described ceramic metallization techniques. These photolithographic techniques also provide the substantially square cross-sectional geometry of the traces. In addition, the present invention features high reliability because of the CTE of the lower dielectric layer is matched to the CTE of the carrier PCB. Finally, as described below in some of the example embodiments provided herein, a wide variety of applications are possible because the combination of ceramic and softboard materials provided by the present invention increases the range of available dielectric constants ("DK") and other material properties. In effect, the DK and other properties can be tailored to fit the application (e.g., hybrid coupler, cross-over, balun, power amplifier, etc.) such that the electrical (RF) performance is optimized.

Figure 2:
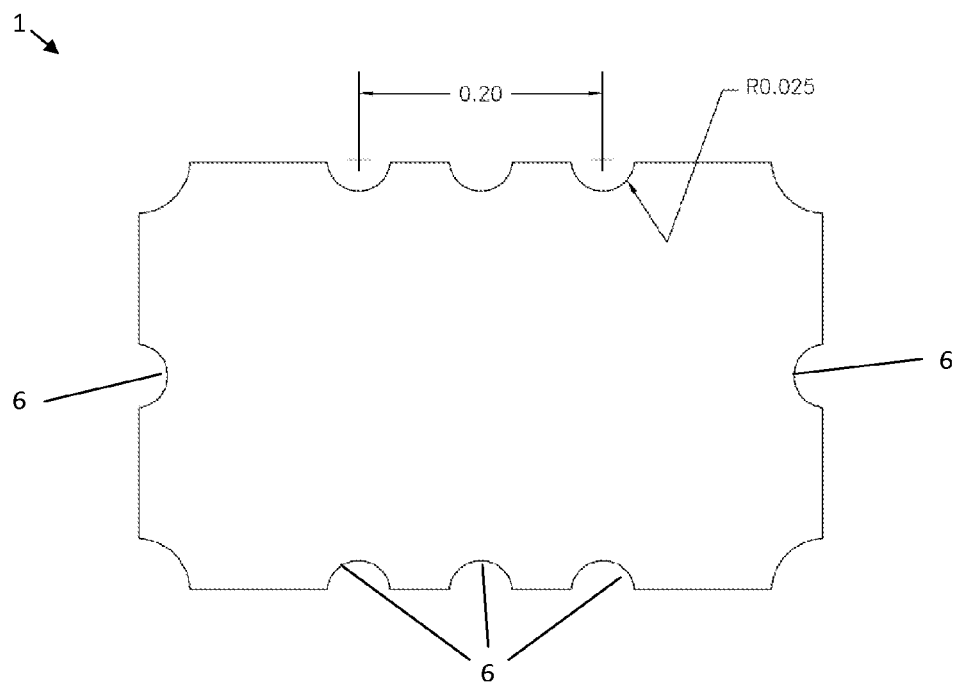
FIG. 2 is a top view of the conventional softboard RF device depicted in FIG. 1.
Figure 3:
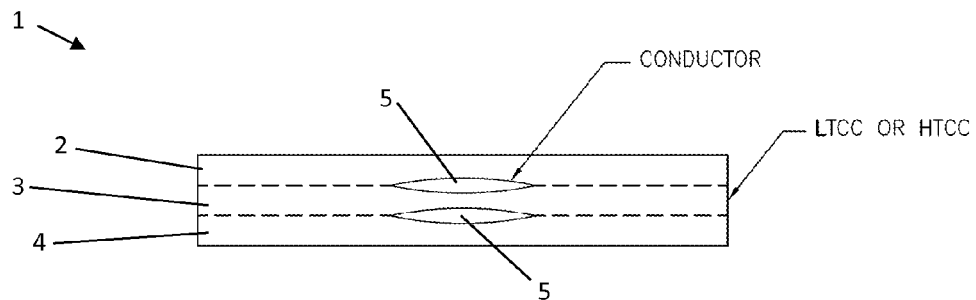
FIG. 3 is a cross-sectional view of a conventional LTCC or HTCC (all-ceramic) device.
Figure 7:
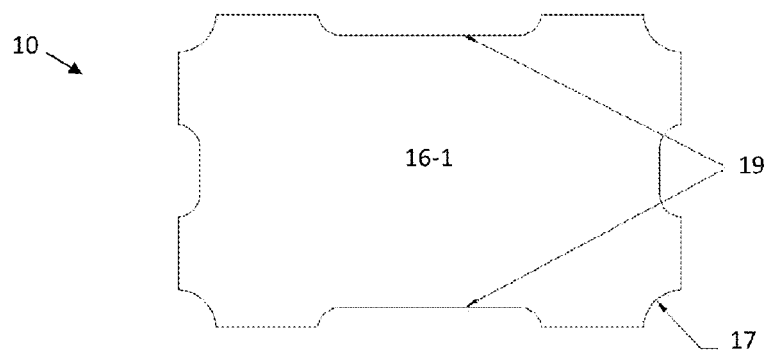
FIG. 7 is a plan view of the RF device depicted in FIG. 6.

Referring to FIG. 7, a top view of the RF device 10 depicted in FIG. 6 is disclosed. In this view, the shape of the device 10 differs from the shape of the conventional device (shown in FIG. 2) because the side vias are replaced by a single edge slot 19. Vias 17 are available at the corner portions of the device. Unlike the conventional device 1, the center ceramic layer provides a substantially uniform three-dimensional thermal distribution (see, e.g., FIG. 10) such that the edge slots 19 can be used for heat dissipation purposes. Assuming 1 mil thick copper, the example in the Background (FIG. 2) shows that the surface area of three vias is about 0.149 mm$^2$. By comparison, the surface area of the slot 19 devoted to heat dissipation is approximately 0.179 mm$^2$. Accordingly, the Slot configuration provides a 20% increase in surface area relative to the conventional device—all of which can be used for heat dissipation.

Figure 8:
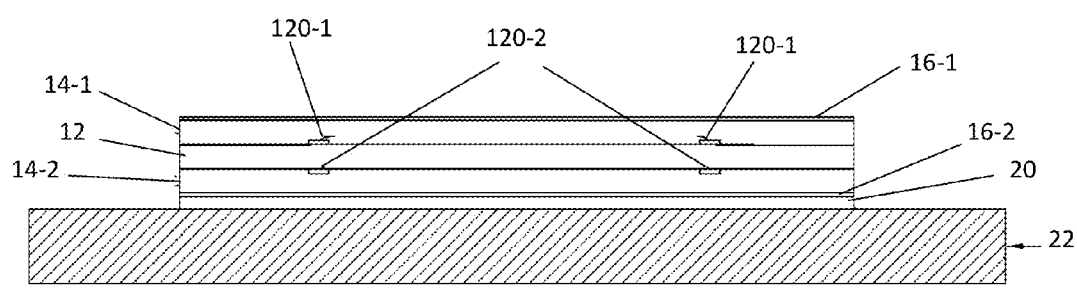
FIG. 8 is a cross-sectional view of the RF device depicted in FIG. 6 and disposed on a carrier printed circuit board (PCB)

Referring to FIG. 8, a cross-sectional view of the RF device depicted in FIG. 6 is disclosed. The device 10 is disposed on a carrier printed circuit board (PCB) 22. As before, the same reference numbers are used for the components. As noted, surface mount components, such as RF device 10, may be attached to a carrier PCB 22 is by using an interface material 20 such as solder or an epoxy. While solder 20 is a "soft" metal, it is prone to fatigue failure (cracking) when subjected to the cyclical stress (such as the thermal cycling) that occurs between materials with different CTEs during RF operation. As described above, by bonding the lower softboard dielectric layer 14-2 directly to the ceramic, it will deform and accommodate the thermal stresses caused by the CTE miss-matches (between the ceramic layer 12, interface layer 20 and the carrier PCB). In other words, because the softboard layer 14-2 deforms and conforms to both the solder joint 20 and the carrier PCB 22 below, and the ceramic layer above, the device is relatively unstressed and system reliability is quite high.

Figure 9:
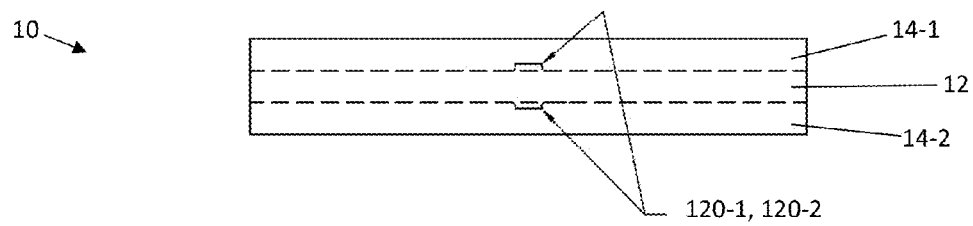
FIG. 9 is a detail cross-sectional view of a typical conductor in the RF device shown in FIG. 6.

Referring to FIG. 9, a detail cross-sectional view of a typical conductor 120 in the RF device 10 shown in FIG. 6 is disclosed. As noted above, photolithographic processes are used to produce the circuit traces 120-1, 120-2. In particular, the conductive foil disposed on the ceramic major surfaces is imaged and etched to produce traces (120) that exhibit the substantially square and uniform edges described previously. These edges, again, are conducive to excellent RF performance.

Figure 10:
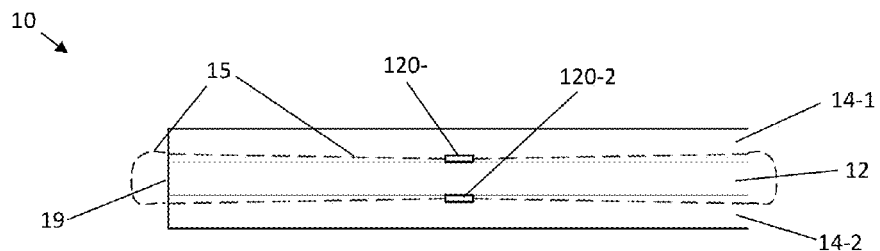
FIG. 10 is a cross-sectional view illustrating the thermal distribution characteristics of the device depicted in FIG. 6.

Referring to FIG. 10, a cross-sectional view illustrating the thermal distribution characteristics of the device 10 depicted in FIG. 6 is disclosed. This view is in contrast to the thermal distribution provided by the conventional device of FIG. 1. In FIG. 10, the thermal distribution 15 of the ceramic layer 12 is substantially uniform over each major surface. Moreover, the thermal energy generated by conductors 120 may also be directed out the device 10 by way of the edge slots 19 as shown. As a result, the present invention reduces the thermal resistance (R) of the device 10 to increase the amount of dissipated power while maintaining device at a given temperature.

The best thermal performance will be achieved by minimizing the thermal Resistance of a system. This is achieved by maximizing the thermal conductivity. Thermal Conductivity (k) is the ability of a material to transport thermal energy due to a temperature gradient. Steady State thermal conductivity is a proportionality constant of the heat flux through a material and the temperature gradient. Using standard heat transfer equations, a person of ordinary skill in the art can show that a maximum temperature (e.g., $T_{max}$=150° C.) will be easily exceeded by a softboard (and therefore fail), while the ceramic layer operates at well below the maximum temperature. In one example calculation, the maximum dissipated power of a softboard device is about 2.44 W, whereas a similar device of the present invention exhibited a maximum power dissipation of 6 W. When an RF coupler is analyzed, for example, the change from an all-softboard stackup to a design in accordance with the present invention, the thermal resistance is decreased by 70% resulting in a 250% increase in power handling.

Figure 11A:
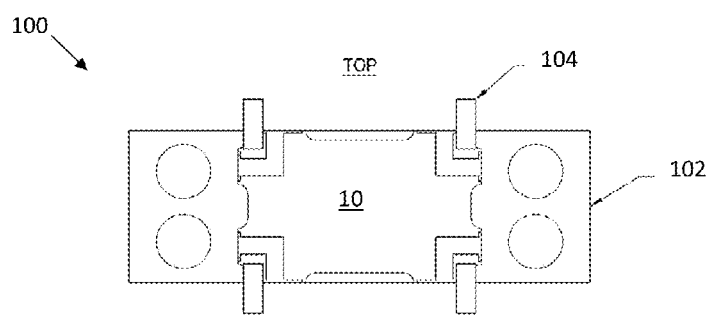
FIGS. 11A-11C include a plan view, a side view and an end view of an RF device in accordance with another embodiment of the present invention.
Figure 11B:
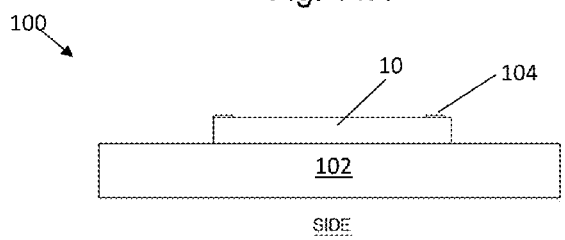
Figure 11C:
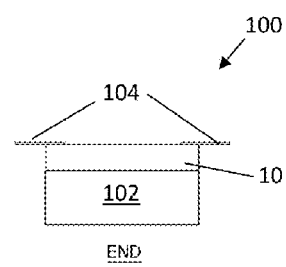

As embodied herein and depicted in FIGS. 11A-11C, a plan view (11A), a side view (11B) and an end view (11C) of an RF device assembly 100 in accordance with another embodiment of the invention are disclosed. For high power applications that require an optimized thermal path, the RF device 10 may be mounted on a metallic flange 102. Because of the deformable nature of the softboard exterior layer 14-2, the device 10 can be bonded to a standard Cu flange 102. The present invention can accommodate any suitable means for bonding the RF circuit 10 to the flange 102. A few non-limiting examples for bonding the RF device to flange 100 include soldering, direct bonding, brazing, or the use of flexible PCB prepregs. (In contrast, note that if an all-ceramic package is bonded to a Cu flange, either the ceramic itself will crack or the bond joining the two will fail due to the CTE mismatch between the CU and the ceramic. Moreover, for all-ceramic packages, the flange material CTE must be matched to the ceramic. Flange materials of this type are very expensive and difficult to fabricate).

Referring to FIG. 12A-12C, a plan view, a side view and an isometric view of an assembly 200 that includes the RF device 10 depicted in FIGS. 11A-11C is disclosed. Specifically, the assembly 200 shows an opening or cavity 202 formed in the carrier PCB 22. The RF device 10 is disposed on a metallic flange 102 and is positioned directly on the heat sink 30, or on the PCB 22 above the heat sink 30, to maximize the thermal conductivity. (The dashed line in FIGS. 12B and 12C indicates an alternative position for the heat sink 30. If the alternative position is implemented, the flange is mounted directly to the heat sink 30). The device 10 includes signal tabs 104 that are connected to corresponding traces 24 on the carrier PCB 22 such that RF signals can propagate between the RF device 10 and the carrier PCB 22 as appropriate.

Figure 13A:
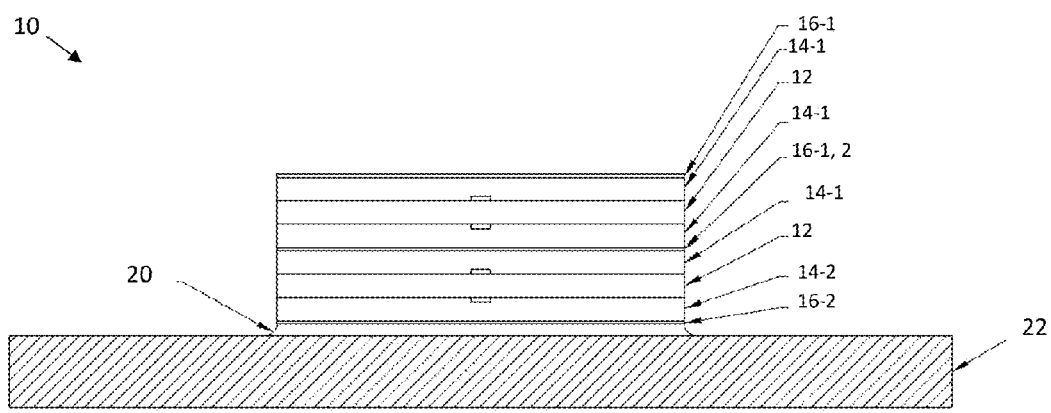
FIG. 13A-13B are cross-sectional views of RF devices in accordance with other embodiments of the present invention.

Referring to FIG. 13A, a cross-sectional view of a multi-layer RF device 10 in accordance with yet another embodiment of the invention is disclosed. In this embodiment, two RF devices 10 (i.e., depicted in FIG. 6) are stacked one atop each other to create a multi layer stripline device. The lower ground plane of the upper device and the upper ground plane of the lower device are implemented by a single ground plane 16-1, 2. The embodiment of FIG. 15, below, may be implemented using this approach.

Figure 4A:
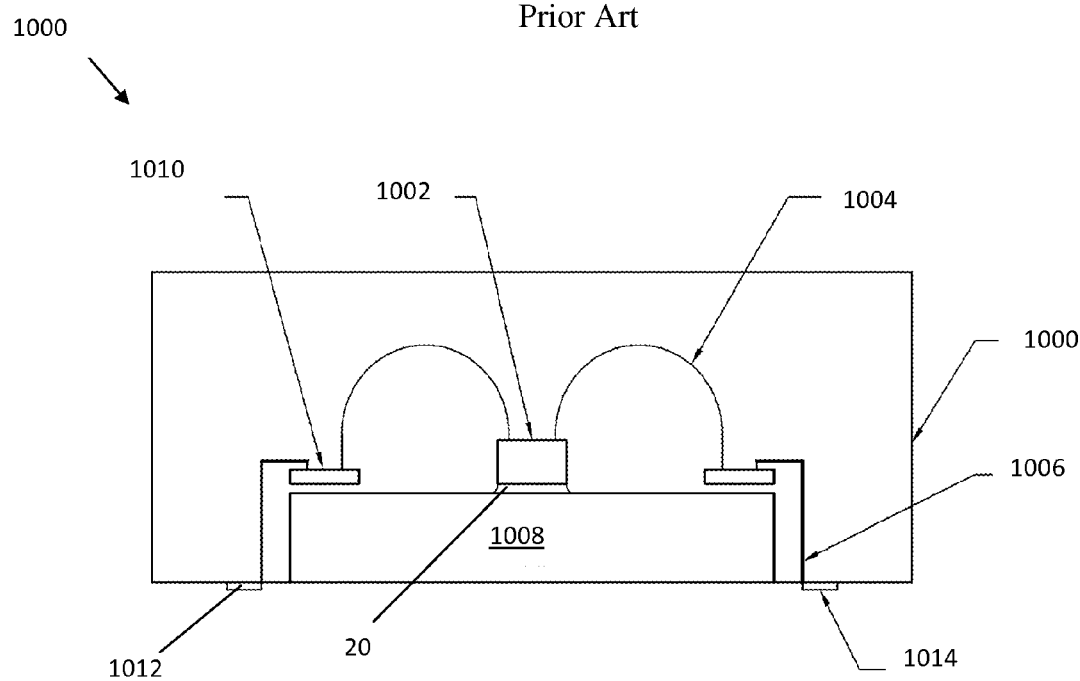
FIGS. 4A-4B are cross-sectional views of conventional SMT power amplifiers.
Figure 4B:
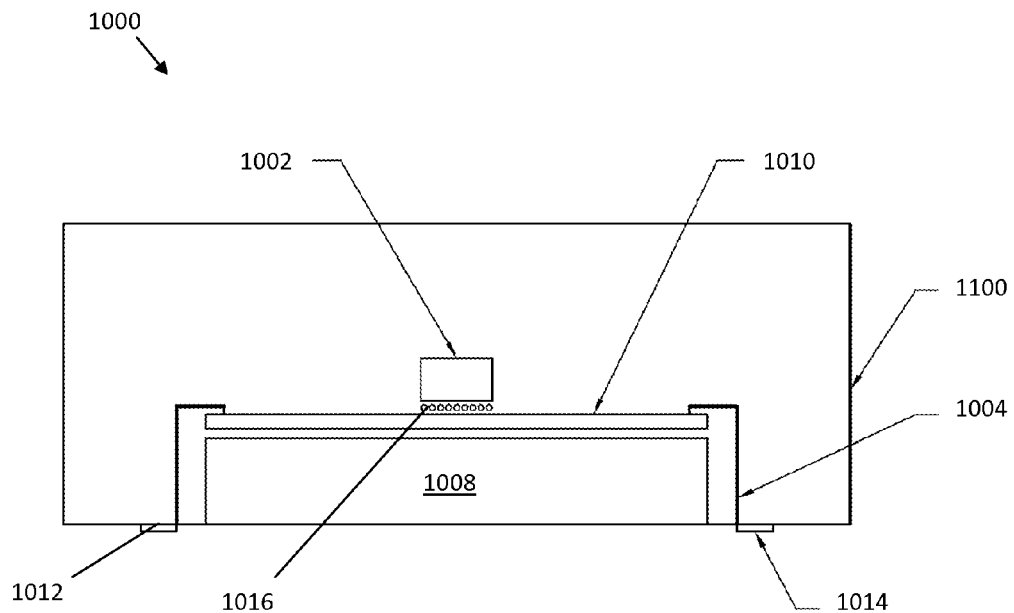
Figure 5:
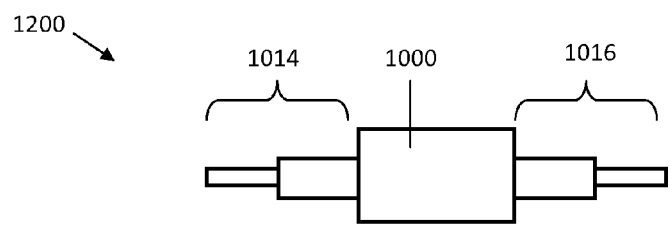
FIG. 5 is a plan view of the conventional power amplifier depicted in FIG. 4.
Figure 13B:
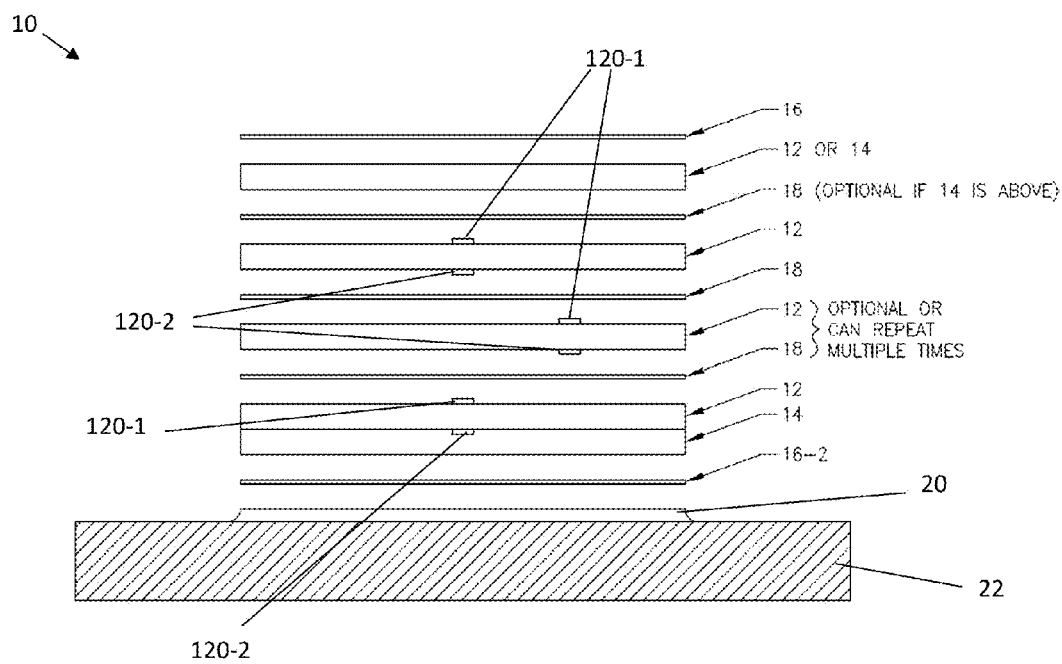

Referring to FIG. 13B, another multi-layer RF assembly 10 is depicted. In this embodiment, the low modulus softboard layer 14-2 is again coupled to the carrier PCB 22 by way of the interface material 20. Depending on the implementation, the interface material may be solder or an epoxy, as before. Like the previous embodiments, the modulus of elasticity of this softboard material should be less than the modulus of the interface material (e.g., solder or epoxy). As before, the lower softboard layer 14 is disposed between the interface material 20 and the ceramic layer 12. However, this embodiment differs from the embodiment of FIG. 6 in that several additional ceramic layers are employed above the lower softboard layer. Stated differently, the lone ceramic layer (of FIG. 6) can be replaced by a multi-layer ceramic structure that includes a center laminated/bonded ceramic layer that is comprised of two or more ceramic sub-layers. The structure of FIG. 13B may be employed in those implementations that require more than two layers of conductive traces. For example, an inverted style balun with DC isolated differential ports may require four layers of conductive traces (See, e.g., FIG. 4 of U.S. Pat. No. 7,605,672). By forming the conductive traces on the ceramic layers, the thermal energy generated by these layers is easily conducted by the ceramic layers to the exterior of the device and dissipated. Note that the top layer of the device may be implemented by a softboard layer 14 or by another ceramic layer.

Reference is made to U.S. Pat. No. 7,646,261, U.S. Pat. No. 7,605,672, U.S. patent application Ser. No. 13/782,279, and U.S. patent application Ser. No. 13/840,137, which are incorporated herein by reference as though fully set forth in their entirety, for a more detailed example of a multi-layer structure that can be used as a coupler, a balun, an impedance transformer or as an RF building block in other devices. For example, the present invention can also be employed to fabricate three or more broadside coupled transmission lines that are vertically aligned with each other. One benefit of multi-layer structures relates to their ability to produce very tight coupling and to realize very compact coupling structures in very small volume. The embodiment of FIG. 13B of the present invention may be used to implement the referenced devices (i.e., '261 patent, '672 patent and the devices described in the pending patent applications) to increase their power handling capabilities by more efficiently and effectively dissipating they thermal energy they generate.

Finally, the reader will also appreciate that two of the multi-conductive layer structures depicted in FIG. 13B may be stacked one on top of the other to implemented the stacked embodiment depicted in FIG. 13A.

Figure 14:
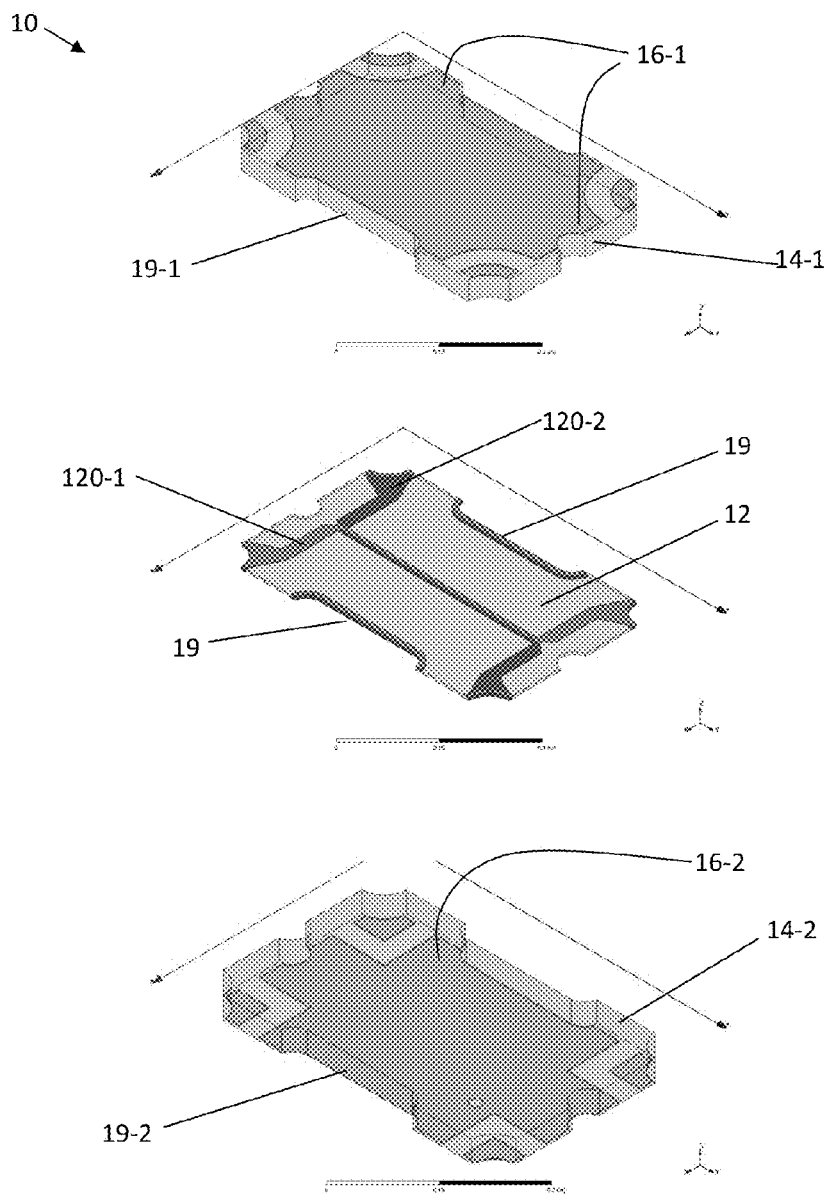
FIG. 14 is an exploded view of an RF hybrid coupler device in accordance with yet another embodiment of the present invention.

As embodied herein and depicted in FIG. 14, an exploded view of an RF hybrid coupler device 10 in accordance with yet another embodiment of the present invention is disclosed. Again, like reference numbers are used for similar parts. Note that the form factor of the coupler 10 is the same as or similar to the form factor of the device depicted in FIG. 7. The upper layer 14-1 is comprised of a softboard material and includes ground plane 16-1 disposed on its upper major surface. Layer 14-1 also includes a slot 19-1 formed therein. The ceramic layer 12 includes a metalized slot 19 formed on each side thereof. A conductive trace 120-1 is disposed on the upper major surface of the ceramic layer 12 and the conductive trace 120-2 is disposed on the opposite major surface of the ceramic layer 12 to form a hybrid coupler. The lower softboard layer 14-2 is again comprised of a very low Modulus material (e.g., a thermoplastic material) in accordance with the teachings of the present invention. A bottom ground plane is formed on the lower surface of layer 14-2 and slot features 19-2 are formed in each side thereof. The composite slot (19, 19-1, and 19-2) provides additional surface area for heat dissipation purposes as described herein. The combination of ceramic and softboard materials provides a wide range of material properties available to the designer—the present invention allows the softboard layers to be DK matched or "tuned" to the ceramic layer depending on the application—an increased number of enhanced RF devices are thus possible. In this example, the dielectric (DK) constant of the softboard layers (14-1, 14-2) is closely matched to the DK constant of the ceramic layer 12.

In one 3 dB hybrid coupler example embodiment, a 5 mil AlN ceramic layer 12 is used for the center board, and the softboard dielectric material RO 3006 HTC (40 mils) is selected for the layer (14-1, 14-2). The 40 mil depth was selected for ground layer (16-1, 16-2) spacing. In this hybrid coupler example, it is desired to have same phase velocity in the even mode and odd mode, hence RO 3006 HTC, having a dielectric constant of 6.25 (which is relative high among all the softboard materials), is used to match to the DK constant (9.0 DK) of the center AlN layer 12. (Those skilled in the art will appreciate that the ceramic layer 12 may also be comprised of an alumina material). The thickness of the centerboard 12 and outboards 14 are decided by the required odd mode impedance (20 ohms) and even mode impedance (120 ohms).

Figure 15:
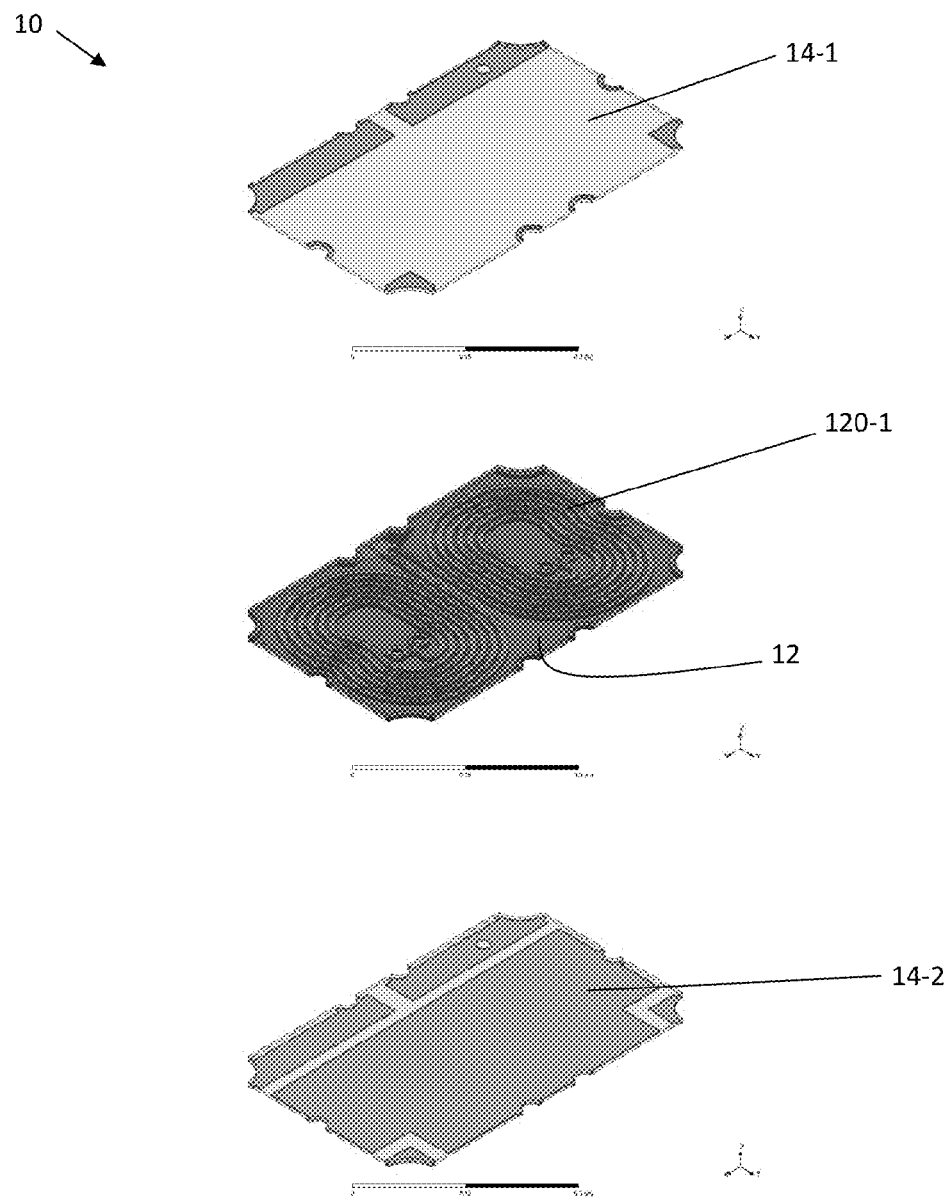
FIG. 15 is an exploded view of an RF device in accordance with yet another embodiment of the present invention.

Referring to FIG. 15, an exploded view of an RF device in accordance with yet another embodiment of the present invention is disclosed. As noted above, the DK constants of the center layer 12 and the outboard layers 14 can be dramatically different. Thus, in an example balun embodiment, a 5 mil AlN (or alumina) ceramic material is used as center layer 12 and a 35 mil softboard dielectric material RO 3035 is selected for the bottom layer 14-2, the thickness also providing for ground spacing. The upper layer 14-1 is implemented by a 5 mil RO 3035 board for encapsulation. This RF device includes two tightly coupled couplers, hence RO 3035, with its relative low DK (3.5), is used to achieve the required high even mode impedance. Of course, those skilled in the art will recognize that baluns very often function as impedance transformers.

Reference is made to U.S. patent application Ser. No. 13/782,279, which is incorporated herein by reference as though fully set forth in its entirety, for a more detailed explanation of a compact broadband coupler impedance transformer that may be implemented using the embodiment of FIG. 15. The '279 application may be employed to implement a balun or impedance transformer structure. This embodiment may also be implemented using the stacked structure disclosed in FIGS. 13A-B.

Figure 16:
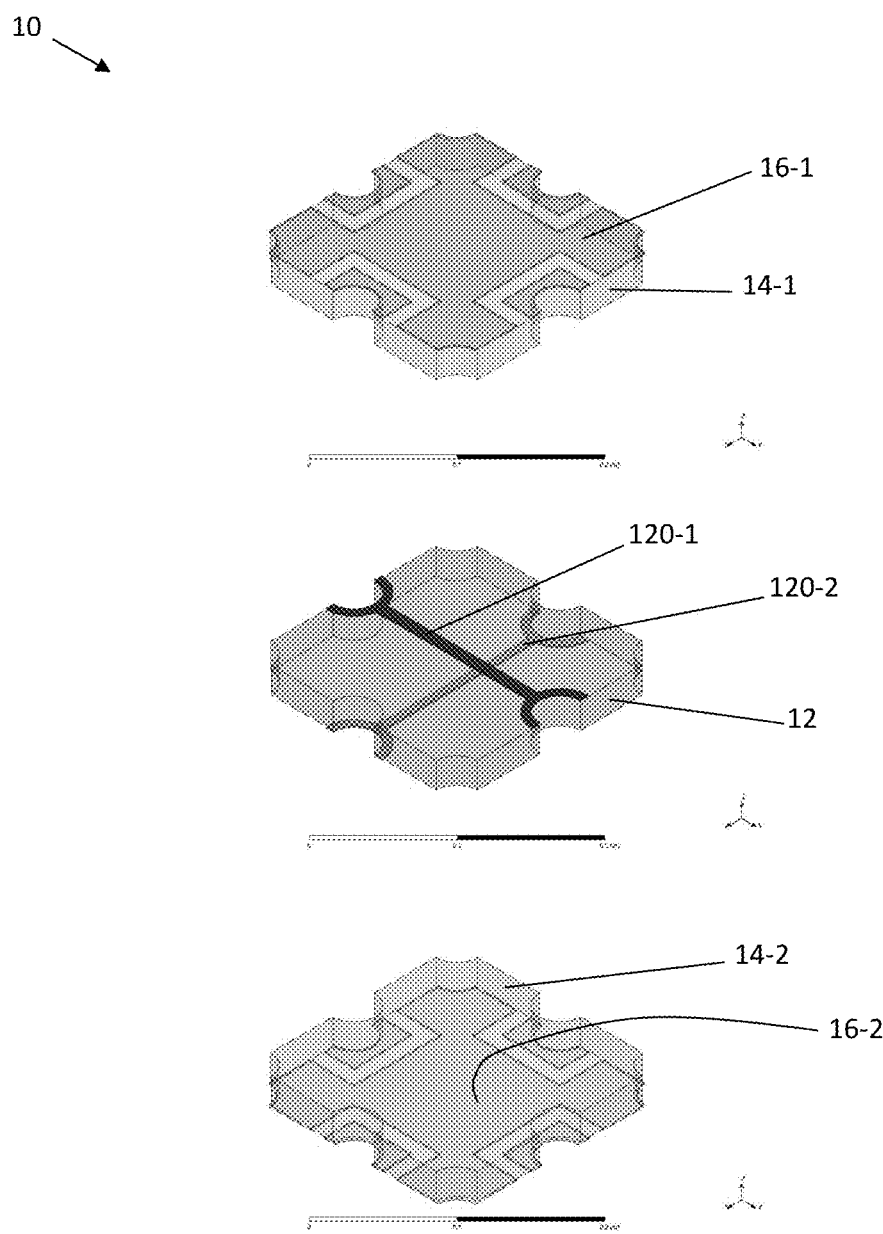
FIG. 16 is an exploded view of an RF cross-over device in accordance with yet another embodiment of the present invention.

Referring to FIG. 16, an exploded view of an RF cross-over device 10 in accordance with yet another embodiment of the present invention is disclosed. In this embodiment, a 25 mil MN ceramic layer is employed as the center layer 12. (Those skilled in the art will appreciate that the ceramic layer 12 may also be comprised of an alumina material). A softboard dielectric material RO 3003 (DK 3.0) having a 25 mil thickness is selected for the top layer 14-1 as well as the bottom layer 14-2. The 25 mil thickness provides the spacing for the ground plane layers (16-1, 16-2).

Figure 17A:
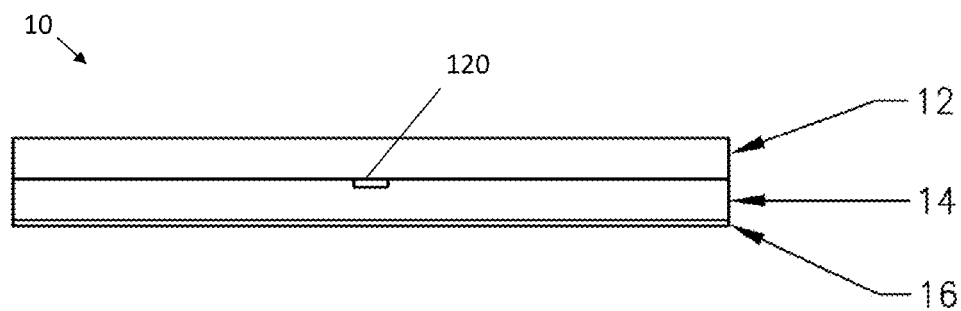
FIG. 17A-17B are cross-sectional views of RF devices in accordance with yet another embodiment of the present invention.
Figure 17B:
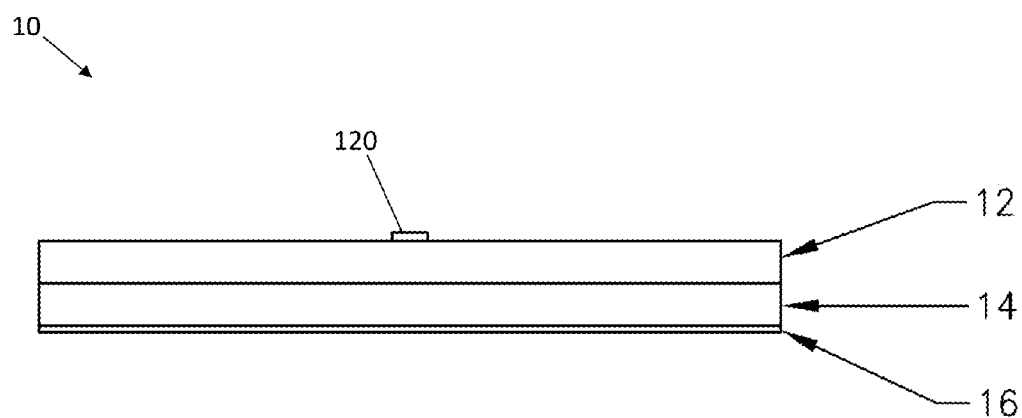

As embodied herein and depicted in FIGS. 17A-17B, cross-sectional views of RF devices in accordance with yet another embodiment of the present invention are disclosed. In this embodiment, the lower layer 14, as before, provides a CTE match with the carrier PCB. However, the upper softboard layer (14-1) is not required. In FIG. 17A, the conductive trace 120 is disposed between the ceramic layer 12 and the lower softboard later 14. In FIG. 17B, the trace 120 is disposed on the ceramic layer 12. This embodiment may be employed to implement microstrip designs, cross-over designs, matching circuits, and the like.

Figure 18A:
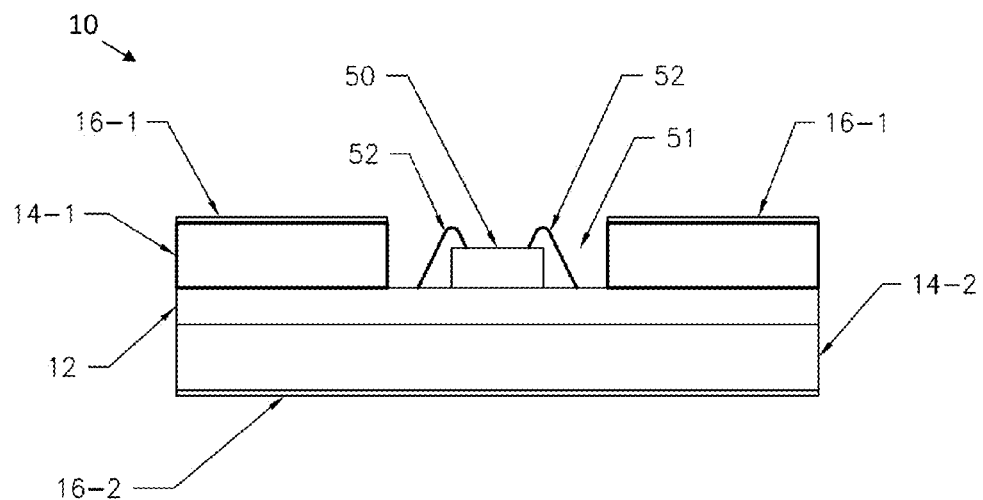
FIG. 18A-18B are cross-sectional views of RF power amplifier devices in accordance with additional embodiments of the present invention.
Figure 18B:
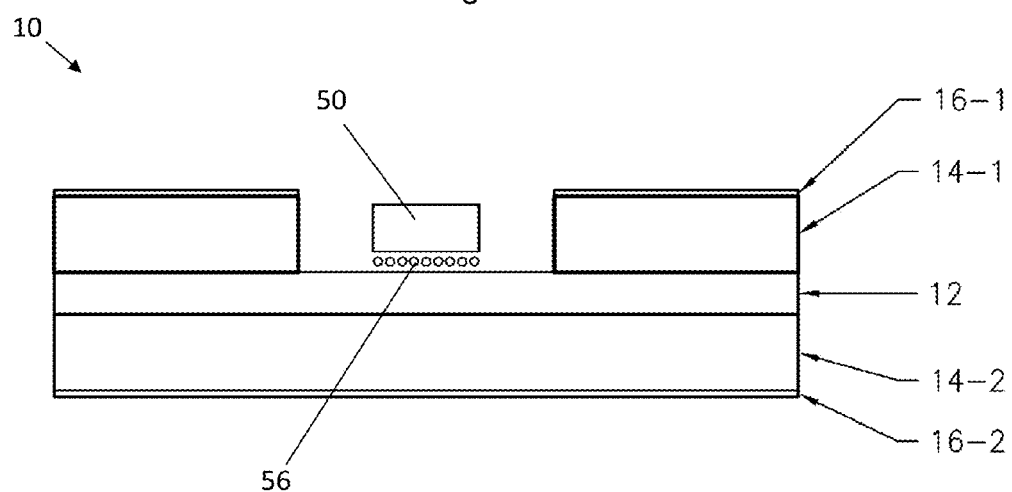

FIG. 18A-18B are cross-sectional views of RF power amplifier devices in accordance with additional embodiments of the present invention. Referring to FIG. 18A, a cross-sectional view of an RF power amplifier device 10 in accordance with yet another embodiment of the present invention is disclosed. In this embodiment, an opening 51 is made in the upper softboard layer 14-1 to accommodate a transistor die 50 and the wire bonding 52. The die 50 is mounted on the ceramic layer 12. The lower softboard layer 14-2 and the copper cladding 16-2 are provided as before.

Referring to FIG. 18B, a flip chip amplifier 50 is soldered (56) on ceramic layer 12. The pads of the flip chip amplifier 50 are connected to conductive traces formed on the ceramic layer 12 in accordance with the principles of the present invention. As before, the lower softboard dielectric layer 14-2 is comprised of a low modulus material that is configured to deform during a thermal cycle and solidify when the device is cooler.

In reference to FIGS. 18A and 18B, a new type of power amplifier design is possible. The ceramic centerboard 12 can be used to implement a variety of RF functions in a footprint that is significantly smaller than what can be achieved using a standard PCB. The ceramic layer provides a solid surface for mounting the die, and as before, distributes the thermal energy throughout the entire structure such that it can be efficiently dissipated by the heat sink.

If an all-softboard layer construction is used, the heat could not be sufficiently dissipated; and on the other hand, if an all-ceramic construction is used, the cavity 51 is extremely difficult to achieve and the cost is essentially prohibitive. Moreover, the RF performance of the all-ceramic device would also be significantly degraded (see previous discussions regarding ceramic tradeoffs).

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An RF device for use in an RF circuit assembly, the RF device being configured to be coupled to an RF circuit assembly interface having an interface modulus of elasticity, the device comprising:

a ceramic layer including a ceramic surface area having a first ceramic major surface and a second ceramic major surface, the ceramic layer being characterized by a ceramic layer dielectric constant, a ceramic layer thickness, and a ceramic modulus of elasticity, the ceramic layer also including an RF circuit arrangement having a predetermined geometry and predetermined electrical characteristics, the ceramic layer being configured to dissipate thermal energy generated by the RF circuit via substantially the entire ceramic surface area; and a first dielectric layer including a first outer major surface configured to be coupled to the RF circuit assembly interface and a first inner major surface coupled to the second ceramic major surface, the first dielectric layer having a predetermined first thickness, a first dielectric constant and a predetermined first modulus of elasticity, the predetermined electrical characteristics of the RF circuit arrangement being a function of the ceramic layer dielectric constant, the ceramic layer thickness, the first dielectric constant, the predetermined first thickness and the predetermined geometry, the predetermined first modulus of elasticity being substantially lower than the interface modulus of elasticity and the ceramic modulus of elasticity such that the first dielectric layer substantially conforms to the ceramic layer and the RF circuit assembly interface when an RF device operating temperature cycles between a maximum and minimum value.

2. The device of claim 1, wherein the first dielectric layer has a coefficient of thermal expansion (CTE) within a range from approximately 15 ppm/degC to approximately 30 ppm/degC.

3. The device of claim 1, wherein the first dielectric layer is comprised of a material selected from a group of materials that includes polyimide, PTFE, glass reinforced materials, or non-glass reinforced materials.

4. The device of claim 1, wherein the first dielectric layer has a modulus of elasticity less than or equal to about $3 \times 10^5$ psi.

5. The device of claim 1, wherein the ceramic layer is an LTCC material or an HTCC material.

6. The device of claim 5, wherein the ceramic layer includes an MN material or an alumina material.

7. The device of claim 1, wherein the ceramic layer and the first dielectric layer are bonded together by a lamination process.

8. The device of claim 7, further comprising an adhesive layer disposed between the ceramic layer and the first dielectric layer.

9. The device of claim 1, wherein the predetermined electrical characteristics include a wavelength, an impedance, an insertion loss, a coupling factor, an isolation value, or an RF power level.

10. The device of claim 1, further comprising a second dielectric layer including a second outer major surface and a second inner major surface coupled to the first ceramic major surface, the first dielectric layer having a predetermined second thickness and characterized by a second dielectric constant.

11. The device of claim 10, wherein the predetermined electrical characteristics of the RF circuit arrangement being a function of the predetermined second thickness and the second dielectric constant.

12. The device of claim 1, wherein the RF circuit arrangement is selected from a group of RF circuit arrangements that include a stripline RF circuit, a microstrip RF circuit, a hybrid coupler, a power amplifier, an impedance transformer, a balun or an RF cross-over device.

13. The device of claim 1, wherein the RF circuit assembly interface includes a carrier PCB.

14. The device of claim 1, wherein the RF circuit assembly interface includes a metallic flange.

15. The device of claim 14, wherein the metallic flange is mounted on a heat sink device.

16. The device of claim 1, wherein the RF circuit arrangement is formed on the ceramic layer by a photolithographic process.

17. The device of claim 1, wherein the RF circuit assembly interface includes a solder material or an epoxy material.

18. The device of claim 1, wherein the RF circuit assembly interface includes a carrier printed circuit board or a metallic flange element.

19. An RF device for use in an RF circuit assembly, the RF device being configured to be coupled to an RF circuit assembly interface having an interface modulus of elasticity, the device comprising:

a first dielectric layer including a first outer major surface and a first inner major surface, the first dielectric layer having a predetermined first thickness and a first dielectric constant;

a ceramic layer including a ceramic surface area having a first ceramic major surface coupled to the first inner major surface and a second ceramic major surface, the ceramic layer being characterized by a ceramic layer dielectric constant and a ceramic modulus of elasticity, the ceramic layer also including an RF circuit arrangement having a predetermined geometry and predetermined electrical characteristics, the ceramic layer being configured to dissipate thermal energy generated by the RF circuit via substantially the entire ceramic surface area; and a second dielectric layer including a second outer major surface configured to be coupled to the RF circuit assembly interface and a second inner major surface coupled to the second ceramic major surface, the second dielectric layer having a predetermined second thickness, a second dielectric constant and a predetermined second modulus of elasticity, the predetermined electrical characteristics of the RF circuit arrangement being a function of the ceramic layer dielectric constant, the predetermined geometry, the first thickness, the second thickness, the first dielectric constant and the second dielectric constant, the predetermined first modulus of elasticity being substantially lower than the interface modulus of elasticity and the ceramic modulus of elasticity such that the second dielectric layer substantially conforms to the ceramic layer and the RF circuit assembly interface when an RF device operating temperature cycles between a maximum and minimum value.

20. The device of claim 19, further comprising: a first conductive ground plane layer coupled to the first outer major surface; and a second conductive ground plane coupled to the second outer major surface.

21. The device of claim 20, wherein the RF circuit arrangement is a stripline circuit arrangement.

22. The device of claim 19, wherein the first ceramic major surface includes a first RF circuit trace arrangement disposed thereon, and the second ceramic major surface includes a second RF circuit trace arrangement disposed thereon.

23. The device of claim 22, wherein the first circuit trace arrangement and the second circuit trace arrangement comprise a stripline RF circuit.

24. The device of claim 22, wherein the RF circuit arrangement is selected from a group of RF circuit arrangements that include a hybrid coupler, a power amplifier, an impedance transformer, a balun or an RF cross-over device.

25. The device of claim 19, wherein the RF circuit arrangement is selected from a group of RF circuit arrangements that include a hybrid coupler, a power amplifier, an impedance transformer, a balun or an RF cross-over device.

26. The device of claim 19, wherein the first dielectric layer or the second dielectric layer have a coefficient of thermal expansion (CTE) within a range from approximately 15 ppm/degC to approximately 30 ppm/degC.

27. The device of claim 19, wherein the first dielectric layer or the second dielectric layer are comprised of a material selected from a group of materials that includes polyimide, PTFE, glass reinforced materials, or non-glass reinforced materials.

28. The device of claim 19, wherein the second dielectric layer has a modulus of elasticity less than or equal to about $3 \times 10^5$ psi.

29. The device of claim 19, wherein the first dielectric layer is comprised of an epoxy material.

30. The device of claim 19, wherein the ceramic layer is an LTCC material or an HTCC material.

31. The device of claim 19, wherein the ceramic layer, the first dielectric layer and the second dielectric layer are bonded together by a lamination process.

32. The device of claim 31, wherein the ceramic layer is comprised of an AlN or an alumina material.

33. The device of claim 19, wherein the ceramic layer is further comprised of:
- a first ceramic layer characterized by a first ceramic layer dielectric constant and a first ceramic modulus of elasticity, the first ceramic layer also including a first RF circuit arrangement having a first predetermined geometry and first predetermined electrical characteristics; and
- at least one second ceramic layer characterized by at least one second ceramic layer dielectric constant and a at least one second ceramic modulus of elasticity, the at least one second ceramic layer also including at least one second RF circuit arrangement having at least one second predetermined geometry and at least one second predetermined electrical characteristics.

34. The device of claim 33, wherein the first RF circuit arrangement and the at least one second RF circuit arrangement are configured to form a balun or an impedance transformer or a vertical interdigital coupler.

35. The device of claim 34, wherein the first RF circuit arrangement and the at least one second RF circuit arrangement are configured to form three or more broadside coupled transmission lines.

36. The device of claim 19, wherein the predetermined electrical characteristics include a wavelength, an impedance, an insertion loss, a coupling factor, an isolation value, or an RF power level.

37. The device of claim 19, further comprising:
- a third dielectric layer including a third outer major surface coupled to the first inner major surface and a third inner major surface, the third dielectric layer having a predetermined third thickness and a third dielectric constant;
- a fourth dielectric layer including a fourth outer major surface coupled to the third major inner surface and a fourth inner major surface, the fourth dielectric layer having a predetermined fourth thickness and a fourth dielectric constant; and
- a fifth dielectric layer including a fifth outer major surface coupled to the fourth inner surface and a fifth inner major surface coupled to the ceramic layer, the fifth dielectric layer having a predetermined fifth thickness and a fifth dielectric constant.

38. The device of claim 37, further comprising a ground plane layer disposed between the third outer major surface and the first outer major surface.

39. The device of claim 38, wherein the fourth dielectric layer is a second ceramic layer characterized by a second ceramic layer dielectric constant, the second ceramic layer also including a second RF circuit arrangement having a second predetermined geometry and second predetermined electrical characteristics, the second ceramic layer being configured to dissipate thermal energy generated by the second RF circuit arrangement via substantially the entire ceramic surface area.

40. The device of claim 37, wherein the third dielectric layer, the fourth dielectric layer, and the fifth dielectric layer are ceramic layers.

41. The device of claim 19, wherein the RF circuit assembly interface includes a solder material or an epoxy material.

42. The device of claim 19, wherein the RF circuit assembly interface includes a carrier printed circuit board or a metallic flange element.

* * * * *

UNITED STATES PATENT AND TRADEMARK OFFICE
CERTIFICATE OF CORRECTION

PATENT NO. : 8,969,733 B1  
APPLICATION NO. : 14/041155  
DATED : March 3, 2015  
INVENTOR(S) : Chong Mei, Michael J. Len and Hans P. Ostergaard Page 1 of 1

It is certified that error appears in the above-identified patent and that said Letters Patent is hereby corrected as shown below:

In the Claims

Col. 15, Claim 6, line 24, please delete "MN" and please insert --AIN--

Signed and Sealed this  
Eighth Day of September, 2015

Michelle K. Lee  
*Director of the United States Patent and Trademark Office*